United States Patent
Umeda

(10) Patent No.: US 10,270,049 B2
(45) Date of Patent: Apr. 23, 2019

(54) ELECTRODE MATERIAL FOR ORGANIC SEMICONDUCTOR DEVICE, METHOD FOR FORMING ELECTRODE PATTERN, AND ORGANIC THIN-FILM TRANSISTOR

(71) Applicant: FUJIFILM Corporation, Tokyo (JP)

(72) Inventor: Kenichi Umeda, Ashigara-kami-gun (JP)

(73) Assignee: FUJIFILM Corporation, Tokyo (JP)

( * ) Notice: Subject to any disclaimer, the term of this patent is extended or adjusted under 35 U.S.C. 154(b) by 0 days.

(21) Appl. No.: 15/953,015

(22) Filed: Apr. 13, 2018

(65) Prior Publication Data

US 2018/0233684 A1 Aug. 16, 2018

Related U.S. Application Data

(63) Continuation of application No. PCT/JP2016/079608, filed on Oct. 5, 2016.

(30) Foreign Application Priority Data

Oct. 14, 2015 (JP) .................................. 2015-202977

(51) Int. Cl.
*H01L 21/28* (2006.01)
*H01L 51/00* (2006.01)
(Continued)

(52) U.S. Cl.
CPC ............ *H01L 51/105* (2013.01); *H01L 21/28* (2013.01); *H01L 21/288* (2013.01);
(Continued)

(58) Field of Classification Search
None
See application file for complete search history.

(56) References Cited

U.S. PATENT DOCUMENTS

2009/0159449 A1 6/2009 Kubo
2013/0001479 A1* 1/2013 Kanehara ............... C09D 11/52
252/519.2

(Continued)

FOREIGN PATENT DOCUMENTS

JP 2009-168797 A 7/2009
JP 2014-236064 A 12/2014
(Continued)

OTHER PUBLICATIONS

International Search Report (PCT/ISA/210) issued in PCT/JP2016/079608, dated Dec. 20, 2016.
(Continued)

*Primary Examiner* — Shaun M Campbell
(74) *Attorney, Agent, or Firm* — Birch, Stewart, Kolasch & Birch, LLP

(57) ABSTRACT

An object of the present invention is to provide an electrode material for an organic semiconductor device with which an excellent electrode pattern can be formed, a method for forming an electrode pattern, and an organic thin-film transistor.

An electrode material for an organic semiconductor device of the present invention includes inorganic nanoparticles, an organic π-conjugated ligand, water, 0.0005% to 15% by mass of a fluorine-based surfactant, and a surface tension adjuster of which a dielectric constant is 20 to 30, in which the organic π-conjugated ligand is a ligand having at least one hydrophilic substituent.

20 Claims, 1 Drawing Sheet

(51) Int. Cl.
   *H01L 51/05*      (2006.01)
   *H01L 51/10*      (2006.01)
   *H01L 21/288*     (2006.01)
   *H01L 29/417*     (2006.01)
   *H01L 29/786*     (2006.01)

(52) U.S. Cl.
   CPC .......... *H01L 29/417* (2013.01); *H01L 29/786* (2013.01); *H01L 51/0022* (2013.01); *H01L 51/05* (2013.01); *H01L 51/0545* (2013.01); *H01L 51/0074* (2013.01); *H01L 51/0078* (2013.01); *H01L 51/0558* (2013.01)

(56)                References Cited

U.S. PATENT DOCUMENTS

2016/0072068 A1*  3/2016  Okamoto ............ H01L 51/0022
                                                  257/40
2016/0072086 A1*  3/2016  Okamoto ............. H01L 51/105
                                                  257/40
2017/0356089 A1*  12/2017 Kanehara ............ C09D 11/322

FOREIGN PATENT DOCUMENTS

WO    WO 2011/114713 A1    9/2011
WO    WO 2016/136364 A1    9/2016

OTHER PUBLICATIONS

Written Opinion of the International Searching Authority (PCT/ISA/237) issued in PCT/JP2016/079608, dated Dec. 20, 2016.

* cited by examiner

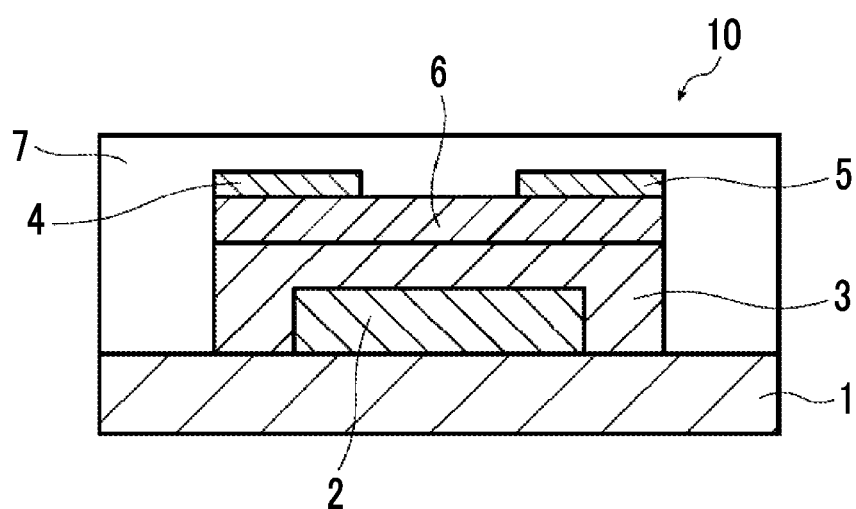

ELECTRODE MATERIAL FOR ORGANIC SEMICONDUCTOR DEVICE, METHOD FOR FORMING ELECTRODE PATTERN, AND ORGANIC THIN-FILM TRANSISTOR

CROSS-REFERENCE TO RELATED APPLICATIONS

This application is a Continuation of PCT International Application No. PCT/JP2016/079608 filed on Oct. 5, 2016, which claims priority under 35 U.S.C. § 119(a) to Japanese Patent Application No. 2015-202977 filed on Oct. 14, 2015. The above application is hereby expressly incorporated by reference, in its entirety, into the present application.

BACKGROUND OF THE INVENTION

1. Field of the Invention

The present invention relates to an electrode material for an organic semiconductor device.

2. Description of the Related Art

A device (hereinafter, also referred to as an "organic semiconductor device") in which an organic semiconductor material is used is attracting great attention since the device is expected to have various advantages compared to a device in the related art in which an inorganic semiconductor material such as silicon is used.

For example, an organic thin film transistor (OTFT) and organic thin film solar cells (organic photovoltaics: OPV) are known as the organic semiconductor device.

It is known that a dispersion (conductive nanoink) containing a dispersion medium and inorganic nanoparticles such as metal nanoparticles is used as a material for forming a conductive circuit and an electrode in such an organic semiconductor device.

For example, WO2011/14713A discloses a "nanoink composition containing inorganic nanoparticles, an organic π-conjugated ligand, and a solvent, wherein the organic π-conjugated ligand is π-bonded to the inorganic nanoparticles and the nanoink composition, has electrical conductivity due to the strong π-bonding and approach between the particles ([claim 1]).

In addition, JP2014-236064A discloses that a rear surface electrode layer is formed in a method for manufacturing an organic thin film solar cell using a dispersion medium containing metal nanoparticles and an organic π-bonded ligand ([claim 1] and [claim 2]).

SUMMARY OF THE INVENTION

The present inventor has conducted studies on the nanoink composition and the dispersion medium disclosed in WO2011/114713A and JP2014-236064A, and as a result, the present inventor has found that, in a case where a solvent or a dispersion medium including water is used, it is difficult to form an electrode pattern, depending on the type of an organic semiconductor.

Therefore, an object of the present invention is to provide an electrode material for an organic semiconductor device with which an excellent electrode pattern can be formed, a method for forming an electrode pattern, and an organic thin-film transistor.

The present inventor has conducted extensive studies in order to achieve the above-described object. As a result, the present inventor found that, in a case where an electrode material for an organic semiconductor device into which a predetermined amount of a fluorine-based surfactant is blended and which includes a specific surface tension adjuster is used, an excellent electrode pattern can be formed, and have completed the present invention.

That is, the present inventor has found that it is possible to achieve the above-described object using the following configuration.

[1] An electrode material for an organic semiconductor device comprising: inorganic nanoparticles; an organic π-conjugated ligand; water; 0.0005% to 15% by mass of a fluorine-based surfactant; and a surface tension adjuster of which a dielectric constant is 20 to 30, in which the organic π-conjugated ligand is a ligand having at least one hydrophilic substituent.

[2] The electrode material for an organic semiconductor device according to [1], in which a content of the surface tension adjuster is less than or equal to 50% by volume with respect to a total volume of the electrode material for an organic semiconductor device.

[3] The electrode material for an organic semiconductor device according to [1] or [2], in which the inorganic nanoparticles are metal nanoparticles.

[4] The electrode material for an organic semiconductor device according to [3], in which the metal nanoparticles contain at least one metal selected from the group consisting of gold, silver, copper, platinum, palladium, nickel, cobalt, iron, aluminum, manganese, ruthenium, indium, rhodium, tin, and zinc.

[5] The electrode material for an organic semiconductor device according to any one of [1] to [4], in which the hydrophilic substituent included in the organic π-conjugated ligand is at least one selected from the group consisting of hydroxyl group, an aldehyde group, a carboxyl group, a carbonyl group, an ester group, an amino group, an alkylamino group, an amide group, an imide group, a phosphonic acid group, a sulfonic acid group, a cyano group, a thiol group, a nitro group, an ether group, and salts thereof.

[6] The electrode material for an organic semiconductor device according to any one of [1] to [5], in which the organic π-conjugated ligand is at least one ligand selected from the group consisting of porphyrin, phthalocyanine, naphthalocyanine, and derivatives thereof.

[7] The electrode material for an organic semiconductor device according to any one of [1] to [6], in which the surface tension adjuster is at least one alcohol-based solvent selected from the group consisting of isopropanol, ethanol, and methoxy ethanol.

[8] A method for forming an electrode pattern on a substrate, the method comprising: a coating film forming step of forming a coating film by coating the substrate with the electrode material for an organic semiconductor device according to any one of [1] to [7].

[9] The method for forming an electrode pattern according to [8], further comprising, before the coating film forming step: a bank forming step of forming a bank at an outer peripheral part of a region in which an electrode pattern is formed.

[10] An organic thin-film transistor comprising: an electrode formed using the electrode material for an organic semiconductor device according to any one of [1] to [7].

[11] The organic thin-film transistor according to [10], comprising: a gate electrode; a gate insulating film; an organic semiconductor layer; and a source electrode and a drain electrode disposed on the organic semiconductor layer, in which any one or both of the source electrode and the drain electrode are the electrodes formed using the electrode material for an organic semiconductor device according to any one of [1] to [7].

[12] The organic thin-film transistor according to [11], in which the organic semiconductor layer has a hydrophobic substituent.

According to the present invention, it is possible to provide an electrode material for an organic semiconductor device with which an excellent electrode pattern can be formed, a method for forming an electrode pattern, and an organic thin-film transistor.

BRIEF DESCRIPTION OF THE DRAWINGS

FIG. 1 is a schematic cross-sectional diagram showing one example of an embodiment of an organic thin-film transistor of the present invention.

DESCRIPTION OF THE PREFERRED EMBODIMENTS

Hereinafter, the present invention will be described in detail.

While the explanation of the constitutional requirements which will be described below is based on the representative embodiments of the present invention, the present invention is not limited to such embodiments.

In the present specification, the numerical range indicated by "to" is used as a meaning of a range including numerical values denoted before and after "to" as a lower limit value and an upper limit value.

[Electrode Material for Organic Semiconductor Device]

An electrode material for an organic semiconductor device of the present invention (hereinafter, abbreviated as an "electrode material of the present invention") contains inorganic nanoparticles, an organic π-conjugated ligand, and water.

In the electrode material of the present invention, a ligand having at least one hydrophilic substituent (hereinafter, also referred to as a "hydrophilic substituent") is used as the organic π-conjugated ligand.

In addition, the electrode material of the present invention includes 0.0005% to 15% by mass of a fluorine-based surfactant.

Furthermore, the electrode material of the present invention includes a surface tension adjuster of which a dielectric constant is 20 to 30.

As described above, in a case where an electrode material for an organic semiconductor device into which a predetermined amount of the fluorine-based surfactant is blended and which includes the specific surface tension adjuster is used, the electrode material of the present invention forms a favorable electrode pattern.

This is not clearly understood in detail; however, the present inventor presumes as follows.

That is, the present inventor considers that, in order to form a favorable electrode pattern in a case where water is used as a solvent or a dispersion medium, surface tension of the electrode material needs to be lowered.

The present inventor conducted studies on blending the surface tension adjuster having a dielectric constant of 20 to 30, from the viewpoint of compatibility with water, and the present inventor found that, in a case where a surface tension adjuster having a boiling point lower than that of water was blended, only the surface tension adjuster was volatilized after being applied onto a base material such as an organic semiconductor layer, and wettability to the base material was gradually lost.

Therefore, in the present invention, it is considered that, since surface tension is lowered using the surface tension adjuster having a dielectric constant of 20 to 30, and the volatilization of a surface tension adjuster is suppressed by blending in a predetermined amount of the fluorine-based surfactant, whereby it is possible to adjust the volatilization level of the surface tension adjuster and water, the electrode pattern thus formed is favorable.

Next, inorganic nanoparticles, an organic π-conjugated ligand, water, fluorine-based surfactant, and surface tension adjuster which are contained in the electrode material of the present invention will be described in detail.

[Inorganic Nanoparticles]

Inorganic nanoparticles contained in the electrode material of the present invention are not particularly limited, and it is possible to use metal nanoparticles, metal oxide particles, and the like which are well-known in the related art.

In the present invention, inorganic nanoparticles are preferably metal nanoparticles for the reason that conductivity of an electrode to be formed becomes favorable. Specifically, the inorganic nanoparticles are more preferably metal nanoparticles containing at least one metal selected from the group consisting of gold (Au), silver (Ag), copper (Cu), platinum (Pt), palladium (Pd), nickel (Ni), cobalt (Co), iron (Fe), aluminum (Al), manganese (Mn), ruthenium (Ru), indium (In), rhodium (Rh), tin (Sn), and zinc (Zn).

Among them, metal nanoparticles containing Ag or Cu are preferable from the viewpoint of practical use and cost. In a case where metal nanoparticles contain Cu, it is preferable that the metal nanoparticles further contain metal elements (Ag, Pd, Pt, and Au) having a reduction potential higher than that of Cu from the viewpoint of oxidation resistance.

Specific examples of Ag raw materials include $Ag(NO_3)$, AgCl, Ag(HCOO), $AG(CH_3COO)$, $Ag(CH_3CH_2COO)$, $Ag_2CO_3$, and $Ag_2SO_4$, and these may be used singly or two or more thereof may be used in combination.

Specific examples of Cu raw materials include $Cu(NO_3)_2$, $CuCl_2$, $Cu(HCOO)_2$, $Cu(CH_3COO)_2$, $Cu(CH_3CH_2COO)_2$, $CuCO_3$, $CuSO_4$, and $C_5H_7CuO_2$, and these may be used singly or two or more thereof may be used in combination.

On the other hand, specific examples of metal oxide particles include indium tin oxide (ITO) particles, antimony tin oxide (ATO) particles, zinc oxide (ZnO which may be doped with Al) particles which may be doped with aluminum, fluorine-doped tin dioxide (F-doped $SnO_2$) particles, and niobium-doped titanium dioxide (Nb-doped $TiO_2$) particles, and these may be used singly or two or more thereof may be used in combination.

The average particle diameter of such inorganic nanoparticles is not particularly limited since it varies depending on the material constituting the particle, but is preferably 3 nm to 500 nm and more preferably 5 nm to 50 nm.

Here, the average particle diameter of inorganic nanoparticles can be obtained by measuring the particle diameters of inorganic nanoparticles in a dispersion medium using a transmission electron microscope (TEM). It is possible to calculate the average particle diameter for example, by measuring the particle diameters of 300 independent metal nanoparticles which do not overlap with each other among the particles observed in a TEM image.

[Organic π-Conjugated Ligand]

The organic π-conjugated ligand included in the electrode material of the present invention is not particularly limited as long as the organic π-conjugated ligand is an organic π-conjugated ligand having a hydrophilic substituent.

Here, the hydrophilic substituent refers to a substituent of which an I/O value obtained using organic nature (O value) and inorganic nature (I value) in "Organic Conceptual Diagram (Yuki Gainen Zu)" (Koda Yoshiki SANKYO SHUPPAN Co., Ltd., 1984) is greater than or equal to 0.5.

Specific examples of the hydrophilic substituent include a hydroxyl group (I/O value: co), an aldehyde group (I/O value: 1.625), a carboxyl group (I/O value: cc), an ester group (I/O value: 1.5), an amino group (I/O value: ∞), a dimethylamino group (I/O value: 1.75), an amide group (I/O value: 1.68), an imide group (I/O value: 2), a phosphonic acid group (I/O value: 19.25), a sulfonic acid group (I/O value: ∞), a cyano group (I/O value: 1.75), a thiol group (I/O value: 0.5), a nitro group (I/O value: 1), an ether group (I/O value: 0.5), and salts thereof. One of these may be used singly, or two or more kinds thereof may be used in combination.

Among these, from the viewpoint of solubility in various solvents as well as water, a dimethylamino group, an amide group, a cyano group, and an aldehyde group are preferable.

In the present invention, as the organic π-conjugated ligand, at least one ligand selected from the group consisting of porphyrin, phthalocyanine, naphthalocyanine, and derivatives thereof is preferable, for the reason that these ligands easily approach the above-described inorganic nanoparticles.

The organic π-conjugated ligand may also have a substituent such as a phosphine group, a halogen group, a selenol group, a sulfide group, and a selenoether group as a coordinating group.

In addition, the organic π-conjugated ligand may have an electron-withdrawing group, for the reason that work function of the above-described inorganic nanoparticles can be increased.

Specific examples of the electron-withdrawing groups include a tosyl group (-Ts), a mesyl group (-Ms), a phenyl group (-Ph), an acyl group (-Ac), a halogen group (for example, —F, —Cl, —Br, and —I), a halogenated alkyl group [—R—X (R represents an alkylene group and X represents a halogen atom)], a halogenated alkylthio group [—S—R—X (R represents an alkylene group and X represents a halogen atom)], a halogenated aryl group [—Ar—X (Ar represents an aryl group and X represents a halogen atom)], and a halogenated arylthio group [—S—Ar—X (Ar represents an aryl group and X represents a halogen atom)], and these functional groups may be provided singly, or two or more groups or two or more types thereof may be provided.

Specific examples of such organic π-conjugated ligand include 2,3,11,12,20,21,29,30-octakis [(2-N,N-dimethylaminoethyl)thio]naphthalocyanine (hereinafter, abbreviated as "OTAN"); 2,3,9,10,16,17,23,24-octakis[(2-N,N-dimethylaminoethyl)thio]phthalocyanine (hereinafter, abbreviated as "OTAP"); 2,3,11,12,20,21,29,30-naphthalocyanine octacarboxylic acid (hereinafter, abbreviated as "OCAN"); and the like.

Among these, OTAN and OTAP, which are shown in the following structural formulas, are preferable.

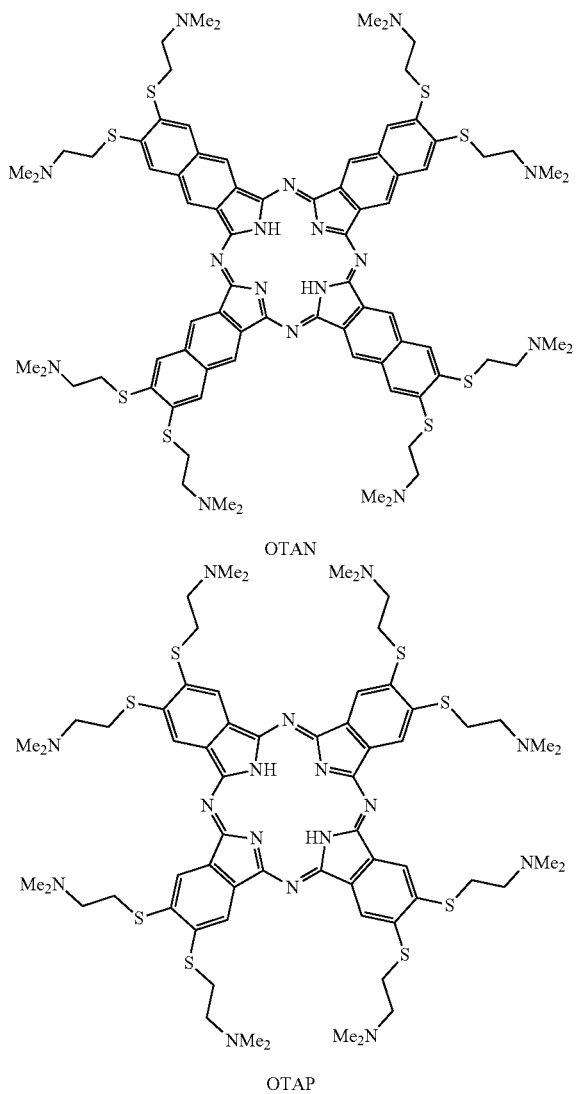

OTAN

OTAP

In the present invention, water solubility of the organic π-conjugated ligand at 25° C. is preferably 0.1 to 100 g/100 ml and more preferably 1 to 50 g/100 ml.

As a solubilization agent, an acid such as formic acid and acetic acid or an alkali such as NaOH and KOH may be added at a proportion of approximately 1%.

In the present invention, a content of organic π-conjugated ligand is preferably 0.001% to 10% by mass and more preferably 0.01% to 5% by mass.

[Water]

The electrode material of the present invention includes water.

A content of water is not particularly limited, however, the content thereof is preferably 10% to 90% by volume and more preferably 20% to 80% by volume, with respect to the total volume of the electrode material for an organic semiconductor device.

Furthermore, a volume ratio between water and the surface tension adjuster which will be described below (water:surface tension adjuster) is preferably 1:3 to 3:1 and more preferably 1:2 to 2:1.

[Fluorine-Based Surfactant]

The fluorine-based surfactant included in the electrode material of the present invention is not particularly limited, and for example, a surfactant having a perfluoroalkyl group in the molecule thereof can be used.

Examples of the fluorine-based surfactant include an anion type such as perfluoroalkyl carboxylate, perfluoroalkyl sulfonate, and perfluoroalkyl phosphoric acid ester; an amphoteric type such as perfluoroalkyl betaine; a cation type such as a perfluoroalkyl trimethyl ammonium salt; a nonionic type such as perfluoroalkyl amine oxide, a perfluoroalkyl ethylene oxide adduct, an oligomer having a perfluoroalkyl group and a hydrophilic group, and oligomer having a perfluoroalkyl group and a lipophilic group, an oligomer having a perfluoroalkyl group, a hydrophilic group, and a lipophilic group, and urethane having a perfluoroalkyl group and a lipophilic group; and the like.

As such fluorine-based surfactant, a commercially available product can be used.

Specific examples of the commercially available product include NOVEC FC-4430, and FC-4432 (all manufactured by Sumitomo 3M Limited), ZONYL FSO-100, FSN-100, FS-300, and FSO (all manufactured by DuPont), EFTOP EF-122A, EF-351, 352, 801, and 802 (manufactured by JEMCO.), MEGAFACE F-470, F-1405, F474, and F-444 (manufactured by DIC CORPORATION), SURFLONS-111, S-112, S-113, S121, S131, S132, S-141, and S-145 (manufactured by AGC SEIMI CHEMICAL CO., LTD.), FTERGENT series (manufactured by NEOS COMPANY LIMITED), Fluorad FC series (manufactured by Minnesota Mining and Manufacturing Company), Monflor (manufactured by Imperial Chemical Industries), and Licowet VPF series (manufactured by Farbwerke Hoechst AG).

Among these, ZONYL FS-300 is preferable.

In the present invention, a content of the fluorine-based surfactant is 0.0005% to 15% by mass, preferably 0.1% to 15% by mass, and more preferably 1% to 12% by mass.

[Surface Tension Adjuster]

The surface tension adjuster included in the electrode material of the present invention is a surface tension adjuster having a dielectric constant of 20 to 30.

Here, the dielectric constant refers to a physical amount that shows how much an atom in a substance responds when an electric field is applied to the substance.

Furthermore, the dielectric constant is generally given as a tensor quantity of a complex number, and in the present specification, a value obtained by squaring refractive index measured using a refractometer and literature values disclosed in "Handbook of optical constants", "Landol t-Boernstein Group 3 Volume 15 Subvolume B", and "Maruzen Publishing Co., LTD, A New Course in Experimental Chemistry (Shin-Jikkenkagaku Koza), $3^{rd}$ ed., vol. 14, p. 2592" can be used.

The dielectric constant of the surface tension adjuster is preferably 20 to 30.

Specific examples of such surface tension adjuster include an alcohol-based solvent such as isopropanol (hereinafter, abbreviated as "IPA") [dielectric constant $\varepsilon$=21.8], ethanol [dielectric constant $\varepsilon$=24], and methoxy ethanol [dielectric constant $\varepsilon$=30], ketones such as acetone [dielectric constant $\varepsilon$=21], and the like. One of these may be used singly, or two or more kinds thereof may be used in combination.

In the present invention, a content of the surface tension adjuster is preferably less than or equal to 50% by volume and more preferably 10% to 50% by volume, with respect to the total volume of the electrode material for an organic semiconductor device.

[Preparation Method]

A method for preparing the electrode material of the present invention is not particularly limited, and it is possible to prepare the electrode material, for example, by mixing each of the above-described components with each other. However, it is preferable to prepare the electrode material by coordinating the organic π-conjugated ligand on the surfaces of the inorganic nanoparticles by subjecting the inorganic nanoparticles to ligand substitution during the mixing.

[Method for Forming Electrode Pattern]

A method for forming an electrode pattern of the present invention is a method for forming an electrode pattern including a coating film forming step of forming a coating film by coating a substrate with the electrode material of the present invention described above.

Here, the substrate for forming the electrode pattern is not particularly limited, and examples thereof include an insulating film and an organic semiconductor layer which will be described below, in a case where an electrode is formed in an organic thin-film transistor.

In addition, the method for applying the electrode material onto the substrate is not particularly limited, and examples thereof include a printing method (for example, a gravure printing method, a screen printing method, a flexographic printing method, an inkjet printing method, and an imprinting method), a spin coating method, a slit coating method, a slit and spin coating method, a dip coating method, and a curtain coating method.

The method for forming an electrode pattern of the present invention preferably includes, before the coating film forming step, a bank forming step of forming a bank at an outer peripheral part of a region in which the electrode pattern is formed, for the reason that an electrode pattern to be formed is more favorable.

Here, specific examples of a material constituting the bank include polyimide, a novolac resin, an epoxy resin, an acrylic resin, TEFLON (registered trademark) resin, and the like, and among these, polyimide is preferable from the viewpoint of liquid repellency and heat resistance.

Examples of a method for forming the bank include a method in which patterning by irradiation with ultraviolet ray using a photosensitive resist containing a dry resist, polyimide, photosensitive glass, and the like and developing are used; a method in which a resist is laminated and applied on polyimide that can be subjected to alkali development, and patterning by irradiation with ultraviolet ray and developing are used; a method in which screen printing or pattern printing by dispenser or inkjet and ultraviolet crosslinking after the printing are used; and the like.

[Organic Thin-Film Transistor]

An organic thin-film transistor of the present invention is an organic thin-film transistor including an electrode formed using the electrode material of the present invention described above.

A suitable form of such organic thin-film transistor is a top contact type organic thin-film transistor including a gate electrode, a gate insulating film, an organic semiconductor layer, and a source electrode and a drain electrode disposed on the organic semiconductor layer, in which any one or both of the source electrode and the drain electrode are the electrodes formed using the electrode material of the present invention.

Specific examples of a suitable form of the transistor include a bottom gate-top contact type organic thin-film transistor including a gate electrode, a gate insulating film covering the gate electrode, an organic semiconductor layer disposed on the gate insulating film, and a source electrode and a drain electrode disposed on the organic semiconductor layer, in which any one or both of the source electrode and the drain electrode are the electrodes formed using the electrode material of the present invention.

More specific examples of a suitable form of the transistor suitably include an organic thin-film transistor 10 including, as shown in FIG. 1, a substrate 1, a gate electrode 2 disposed on the substrate 1, a gate insulating film 3 covering the gate electrode 2, an organic semiconductor layer 6 disposed on the gate insulating film 3, a source electrode 4 and a drain electrode 5 disposed on the organic semiconductor layer 6, and a predetermined sealing layer 7 covering each member.

Next, a substrate, a gate electrode, a gate insulating film, a source electrode, a drain electrode, an organic semiconductor layer, and a predetermined sealing layer included in the organic thin-film transistor which is a suitable form of the present invention will be described in detail.

[Substrate]

The substrate takes the role of supporting the gate electrode, the source electrode, and the drain electrode which will be described below.

The type of the substrate is not particularly limited, and examples thereof include a plastic substrate, a glass substrate, a ceramic substrate, and the like. Among these, from the viewpoint of applicability to each device and cost, a glass substrate or a plastic substrate is preferable.

Examples of a material for the plastic substrate include a thermosetting resin (for example, an epoxy resin, a phenol resin, a polyimide resin, a polyester resin, and the like) or a thermoplastic resin (for example, a phenoxy resin, polyethersulfone, polysulfone, polyphenylene sulfone, and the like).

Examples of a material for the ceramic substrate include alumina, aluminum nitride, zirconia, silicon, silicon nitride, silicon carbide, and the like.

Examples of a material for the glass substrate include soda glass, potash glass, borosilicate glass, quartz glass, aluminosilicate glass, lead glass, and the like.

[Gate Electrode]

Examples of a material for the gate electrode include a metal such as gold (Au), silver, aluminum (Al), copper, chromium, nickel, cobalt, titanium, platinum, magnesium, calcium, barium, and sodium; a conductive oxide such as $InO_2$, $SnO_2$, and ITO; a conductive polymer such as polyaniline, polypyrrole, polythiophene, polyacetylene, and polydiacetylene; a semiconductor such as silicon, germanium, and gallium arsenide; a carbon material such as fullerene, carbon nanotube, and graphite, and the like. Among these, metal is preferable, and silver and aluminum are more preferable.

A thickness of the gate electrode is not particularly limited, however, the thickness is preferably 20 to 200 nm.

In addition, in the present invention, as the material for the gate electrode, the electrode material of the present invention may be used, as in the case of any one or both of the source electrode and the drain electrode.

A method for forming the gate electrode is not particularly limited, and examples thereof include a method of vacuum vapor depositing or sputtering the electrode material onto the substrate, a method of applying or printing a composition for forming an electrode, and the like. In a case of patterning an electrode, examples of a method for the patterning include a photolithography method; a printing method such as inkjet printing, screen printing, offset printing, and anastatic printing; and mask vapor deposition method, and the like.

[Gate Insulating Film]

Examples of a material for the gate insulating film include a polymer such as polymethyl methacrylate, polystyrene, polyvinyl phenol, polyimide, polycarbonate, polyester, polyvinyl alcohol, polyvinyl acetate, polyurethane, polysulfone, polybenzoxazole, polysilsesquioxane, an epoxy resin, and a phenol resin; an oxide such as silicon dioxide, aluminum oxide, and titanium oxide; a nitride such as silicon nitride, and the like. Among these materials, in view of compatibility with the organic semiconductor layer, a polymer is preferable.

In a case where the polymer is used as the material for the gate insulating film, a cross-linking agent (for example, melamine) is preferably used in combination. By using a cross-linking agent in combination with the polymer, the polymer is crosslinked, and durability of the gate insulating film that is formed is improved.

A film thickness of the gate insulating film is not particularly limited, and the film thickness is preferably 100 to 1000 nm.

A method for forming the gate insulating film is not particularly limited, and examples thereof include a method of applying a composition for forming a gate insulating film on the substrate on which the gate electrode is formed, a method of vapor depositing or sputtering a gate insulating film material, and the like. A method of applying the composition for forming a gate insulating film is not particularly limited, and a well-known method (a bar-coating method, a spin coating method, a knife coating method, and a doctor blade method) can be used.

In a case of forming the gate insulating film by applying the composition for forming a gate insulating film, heating (baking) may be performed after the application, for the purpose of removing a solvent, crosslinking, and the like.

[Source Electrode and Drain Electrode]

Any one or both of the source electrode and the drain electrode are formed using the electrode material of the present invention using, for example, the method for forming an electrode pattern of the present invention described above.

Channel lengths of the source electrode and the drain electrode are not particularly limited, however, the channel lengths are preferably 5 to 100 μm.

Channel widths of the source electrode and the drain electrode are not particularly limited, however, the channel widths are preferably 50 to 500 μm.

[Organic Semiconductor Layer]

An organic semiconductor material constituting the organic semiconductor layer is not particularly limited, and a well-known material used as an organic semiconductor layer of an organic semiconductor transistor can be used. Specific examples of the material include pentacenes such as 6,13-bis(triisopropylsilylethynyl)pentacene (TIPS pentacene), tetramethyl pentacene, and perfluoropentacene; acenes; thienoacenes such as benzothieno[3,2-b], benzothiophene (BTBT) 4 and dinaphtho[2,3-b:2',3'-f]thieno[3,2-b] thiophene (DNTT); porphyrins; anthradithiophenes such as TES-ADT and 2,8-difluoro-5,11-bis(triethylsilylethynyl)anthradithiophene (diF-TES-ADT); benzothienobenzothiophenes such as DPh-BTBT and Cn-BTBT; dinaphthothienothiophenes such as Cn-DNTT; dioxaanthanthrenes such as perixanthenoxanthene; rubrenes; fullerenes such as C60 and PCBM; phthalocyanines such as copper phthalocyanine and fluorinated copper phthalocyanine; polythiophenes such as P3RT, PQT, P3HT, and PQT; polythienothiophenes such as poly[2,5-bis(3-dodecylthiophen-2-yl)thieno[3,2-b]thiophene] (PBTTT); and the like.

A thickness of the organic semiconductor layer is not particularly limited, however, the thickness is preferably 10 to 200 nm.

In the present invention, a form in which the organic semiconductor layer has a hydrophobic substituent (hereinafter, referred to as a "hydrophobic substituent") is preferable, in order to cause the result of the present invention to be remarkable.

Here, a hydrophobic substituent refers to a substituent of which an I/O value obtained using organic nature (O value) and inorganic nature (I value) in "Organic Conceptual Diagram (Yuki Gainen Zu)" (Koda Yoshiki SANKYO SHUPPAN Co., Ltd., 1984) is smaller than or equal to 0.25.

Specific examples of the hydrophobic substituent include an aliphatic hydrocarbon group such as a methyl group (I/O value: 0), an ethyl group (I/O value: 0), and a propyl group (I/O value: 0) and an aromatic hydrocarbon group such as a phenyl group (I/O value: 0.125).

A method for forming the organic semiconductor layer is not particularly limited, and examples thereof include a method in which a composition for an organic semiconductor obtained by dissolving the organic semiconductor material in a solvent is applied onto the substrate on which the gate electrode, the gate insulating film, the source electrode, and the drain electrode are formed. Specific examples of a method for applying the composition for an organic semiconductor are the same as the method for applying the composition for forming a gate insulating film. In a case of forming the organic semiconductor layer by applying the composition for an organic semiconductor, heating (baking) may be performed after the application, for the purpose of removing the solvent, crosslinking, and the like.

[Sealing Layer]

The organic thin-film transistor of the present invention preferably includes a sealing layer on the outermost layer, from the viewpoint of durability. As the sealing layer, a well-known sealant can be used.

A thickness of the sealing layer is not particularly limited, however, the thickness is preferably 0.2 to 10 µm.

A method for forming the sealing layer is not particularly limited, and examples thereof include a method in which a composition for forming a sealing layer is applied onto the substrate on which the gate electrode, the gate insulating film, the source electrode, the drain electrode, and the organic semiconductor layer are formed. Specific examples of a method for applying the composition for forming a sealing layer are the same as the method for applying the composition for forming a gate insulating film. In a case of forming the organic semiconductor layer by applying the composition for forming a sealing layer, heating (baking) may be performed after the application, for the purpose of removing a solvent, crosslinking, and the like.

EXAMPLES

The present invention will be described in more detail based on the following Examples. The material, the usage, the proportion, treatment contents, a treatment procedure, and the like shown in Examples below can be appropriately modified without departing from the gist of the present invention. Accordingly, the scope of the present invention should not be restrictively interpreted using Examples shown below.

Example 1

<Inorganic Nanoparticles/Organic π-Conjugated Ligand>

An aqueous solution of OTAN protecting π-junction metal nanoparticles in which OTAN (ligand: phthalocyanine) is coordinated on the surfaces of gold nanoparticles was prepared according to the method described in Example 2 (paragraphs [0049] to [0052]) of WO2011/114713A.

<Preparation of Electrode Material>

An electrode material was prepared by adding a fluorine-based surfactant (ZONYL FS-300, manufactured by DuPont) and, as a surface tension adjuster, IPA (dielectric constant: 21.8) to the aqueous solution of the OTAN protecting π-junction metal nanoparticles prepared above such that the contents thereof became those shown in Table 1 below and mixing the components.

The material was prepared such that the volume ratio between the solvent of the aqueous solution of the OTAN protecting π-junction metal nanoparticles (water) and the surface tension adjuster (water:surface tension adjuster) became 1:1.

<Production of Organic Thin-Film Transistor>

An $N^+$ silicon substrate having a 350-nm-thick thermal oxide film provided on the surface thereof was spin-coated with a chloroform solution in which the content of C8-BTBT (manufactured by Sigma-Aldrich, Inc.) represented by the following formula was 0.4% by mass at 3000 rpm to form a coating film, and drying was performed at 80° C., thereby forming an organic semiconductor layer.

Next, a bank was formed by coating the periphery of an electrode pattern forming part on the organic semiconductor layer with TeflonH AF 1600 (manufactured by DuPont) in a shape of a pattern, using a dispenser (Musashi Engineering, Image Master 350 PC).

Subsequently, a source electrode and a drain electrode coated with the electrode material were formed on the organic semiconductor surrounded by the bank using an inkjet apparatus (DMP2830, manufactured by FUJIFILM Dimatix, Inc.), and a bottom gate-top contact type organic thin-film transistor was produced.

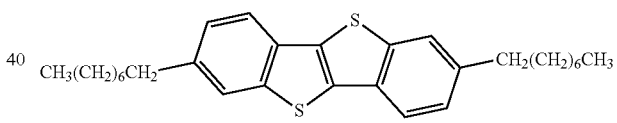

Examples 2 to 4 and Comparative Examples 1 to 6

Organic thin-film transistors were produced according to the same method as in Example 1, except that the kind of the surfactant, the kind of the surface tension adjuster, and whether the bank was formed or not were changed as shown in Table 1 shown below.

In Table 1 below, denotation of the symbol "−" indicates that the corresponding item (the surfactant or the surface tension adjuster) was not used.

Furthermore, a nonionic surfactant used in Comparative Example 6 is OLFINE PD002W manufactured by Nissin Chemical Co., Ltd.

Example 5 and Comparative Examples 7 and 8

Organic thin-film transistors were produced according to the same method as in Example 1, except that an aqueous solution of a metal ink (Drycure Au, manufactured by COLLOIDAL INK Co., Ltd.) was used as a dispersion in which the organic π-conjugated ligand was coordinated on the surfaces of the inorganic nanoparticles, and the kind of the surfactant and the kind of the surface tension adjuster were changed as shown in Table 2 below.

Example 6 and Comparative Examples 9 and 10

Organic thin-film transistors were produced according to the same method as in Example 1, except that an aqueous solution of a metal ink (Drycure Ag, manufactured by COLLOIDAL INK Co., Ltd.) was used as a dispersion in which the organic π-conjugated ligand was coordinated on the surfaces of the inorganic nanoparticles, and the kind of the surfactant and the kind of the surface tension adjuster were changed as shown in Table 2 below.

[Evaluation]
(1) Evaluation of Pattern

Each electrode pattern of the source electrodes and the drain electrodes in the organic thin-film transistors thus produced was visually observed.

As a result, an electrode pattern which was a continuous film and an electrode pattern of which the end portion is linear was evaluated as "A", an electrode pattern which was a continuous film and an electrode pattern of which the end portion was a wave shape derived from a dot formed in the case where the electrode material was applied was evaluated as "B", and an electrode pattern which was not a continuous film was evaluated as "C". The results are shown in Tables 1 and 2 below.

(2) Electrode Performance

TFT characteristics of the organic thin-film transistors thus produced were measured using a semiconductor parameter analyzer (Agilent 4155, manufactured by Agilent Technologies).

As a result, a case where an On-Off ratio is four digits or greater, and mobility is higher than or equal to $0.1\ cm^2 \cdot V.s$ is evaluated as "A", and a case where the On-Off ratio is smaller than four digits, or the mobility is lower than $0.1\ cm^2 \cdot V.s$ is evaluated as "B". The results are shown in Tables 1 and 2 below.

TABLE 1

| | Inorganic nano-particles | Organic π-conjugated ligand | | Solvent | Surfactant | | Content (% by mass) |
|---|---|---|---|---|---|---|---|
| | | Ligand | Hydrophilic substituent | | Type | Product number | |
| Example 1 | Au | Phthalocyanine (OTAN) | Dimethylamino group | Aqueous solution | Fluorine-based | ZONYL FS-300 | 10 |
| Example 2 | Au | Phthalocyanine (OTAN) | Dimethylamino group | Aqueous solution | Fluorine-based | ZONYL FS-300 | 10 |
| Example 3 | Au | Phthalocyanine (OTAN) | Dimethylamino group | Aqueous solution | Fluorine-based | ZONYL FS-300 | 10 |
| Example 4 | Au | Phthalocyanine (OTAN) | Dimethylamino group | Aqueous solution | Fluorine-based | ZONYL FS-300 | 10 |
| Comparative Example 1 | Au | Phthalocyanine (OTAN) | Dimethylamino group | Aqueous solution | Fluorine-based | ZONYL FS-300 | 10 |
| Comparative Example 2 | Au | Phthalocyanine (OTAN) | Dimethylamino group | Aqueous solution | Fluorine-based | ZONYL FS-300 | 10 |
| Comparative Example 3 | Au | Phthalocyanine (OTAN) | Dimethylamino group | Aqueous solution | Fluorine-based | ZONYL FS-300 | 10 |
| Comparative Example 4 | Au | Phthalocyanine (OTAN) | Dimethylamino group | Aqueous solution | — | — | 0 |
| Comparative Example 5 | Au | Phthalocyanine (OTAN) | Dimethylamino group | Aqueous solution | Fluorine-based | ZONYL FS-300 | 20 |
| Comparative Example 6 | Au | Phthalocyanine (OTAN) | Dimethylamino group | Aqueous solution | Nonionic | OLFINE PD-002W | 0.3 |

| | Surface tension adjuster | | | Bank formation | Pattern evaluation | Electrode performance |
|---|---|---|---|---|---|---|
| | Kind | Dielectric constant | Content (% by volume) | | | |
| Example 1 | IPA | 21.8 | 50 | Formed | A | A |
| Example 2 | IPA | 21.8 | 50 | Not Formed | B | A |
| Example 3 | Ethanol | 24 | 50 | Formed | A | A |
| Example 4 | Ethanol | 24 | 50 | Not Formed | B | A |
| Comparative Example 1 | — | — | 0 | Formed | C | B |
| Comparative Example 2 | Butanol | 18 | 50 | Formed | C | B |
| Comparative Example 3 | Ethylene glycol | 38 | 50 | Formed | C | B |
| Comparative Example 4 | IPA | 21.8 | 50 | Formed | C | B |
| Comparative Example 5 | IPA | 21.8 | 50 | Formed | A | B |
| Comparative Example 6 | IPA | 21.8 | 50 | Formed | C | B |

TABLE 2

| | Inorganic nano-particles | Organic π-conjugated ligand | | | Surfactant | | |
|---|---|---|---|---|---|---|---|
| | | Trade name | Hydrophilic substituent | Solvent | Type | Product number | Content (% by mass) |
| Example 5 | Au | Drycure | Present | Water | Fluorine-based | ZONYL FS-300 | 10 |
| Comparative Example 7 | Au | Drycure | Present | Water | Nonionic | OLFINE PD-002W | 0.3 |
| Comparative Example 8 | Au | Drycure | Present | Water | Nonionic | OLFINE PD-002W | 0.3 |
| Example 6 | Ag | Drycure | Present | Water | Fluorine-based | ZONYL FS-300 | 10 |
| Comparative Example 9 | Ag | Drycure | Present | Water | Nonionic | OLFINE PD-002W | 0.3 |
| Comparative Example 10 | Ag | Drycure | Present | Water | Nonionic | OLFINE PD-002W | 0.3 |

| | Surface tension adjuster | | | Bank formation | Pattern evaluation | Electrode performance |
|---|---|---|---|---|---|---|
| | Kind | Dielectric constant | Content (% by volume) | | | |
| Example 5 | IPA | 21.8 | 50 | Formed | A | A |
| Comparative Example 7 | IPA | 21.8 | 50 | Formed | C | B |
| Comparative Example 8 | Propylene glycol | 32 | 50 | Formed | C | B |
| Example 6 | IPA | 21.8 | 50 | Formed | A | A |
| Comparative Example 9 | IPA | 21.8 | 50 | Formed | C | B |
| Comparative Example 10 | Propylene glycol | 32 | 50 | Formed | C | B |

As shown in Table 1 and Table 2, it was found that, in a case where the surface tension adjuster was not blended in, or in a case where a surface tension adjuster of which the dielectric constant was outside the range of 20 to 30 was blended in, the electrode pattern was deteriorated, and the electrode performance was also inferior (Comparative Examples 1 to 3).

It was also found that, in a case where the fluorine-based surfactant was not blended in, the electrode pattern was deteriorated, and the electrode performance was also inferior, regardless of whether the nonionic surfactant was added or not (Comparative Examples 4 and 6 to 10).

Furthermore, it was found that, in a case where the fluorine-based surfactant was blended in at a content of 20% by mass, the electrode pattern was favorable, however, the electrode performance was inferior, and thus, the organic thin-film transistor could not be practically used (Comparative Example 5).

On the other hand, it was found that, in a case where the fluorine-based surfactant was blended in at a predetermined amount, and a surface tension adjuster having a dielectric constant of 20 to 30 was blended in, the electrode pattern was favorable, and excellent electrode performance was also able to be maintained (Examples 1 to 6).

EXPLANATION OF REFERENCES

1: substrate
2: gate electrode
3: gate insulating film
4: source electrode
5: drain electrode
6: organic semiconductor layer
7: sealing layer
10: organic thin-film transistor

What is claimed is:

1. An electrode material for an organic semiconductor device comprising:
   inorganic nanoparticles;
   an organic π-conjugated ligand;
   water;
   0.0005% to 15% by mass of a fluorine-based surfactant; and
   a surface tension adjuster of which a dielectric constant is 20 to 30,
   wherein the organic π-conjugated ligand is a ligand having at least one hydrophilic substituent.

2. The electrode material for an organic semiconductor device according to claim 1,
   wherein a content of the surface tension adjuster is less than or equal to 50% by volume with respect to a total volume of the electrode material for an organic semiconductor device.

3. The electrode material for an organic semiconductor device according to claim 1,
   wherein the inorganic nanoparticles are metal nanoparticles.

4. The electrode material for an organic semiconductor device according to claim 3,
   wherein the metal nanoparticles contain at least one metal selected from the group consisting of gold, silver, copper, platinum, palladium, nickel, cobalt, iron, aluminum, manganese, ruthenium, indium, rhodium, tin, and zinc.

5. The electrode material for an organic semiconductor device according to claim 1, wherein the hydrophilic substituent included in the organic π-conjugated ligand is at least one selected from the group consisting of hydroxyl group, an aldehyde group, a carboxyl group, a carbonyl group, an ester group, an amino group, an alkylamino group, an amide group, an imide group, a phosphonic acid group, a sulfonic acid group, a cyano group, a thiol group, a nitro group, an ether group, and salts thereof.

6. The electrode material for an organic semiconductor device according to claim 1,
wherein the organic π-conjugated ligand is at least one ligand selected from the group consisting of porphyrin, phthalocyanine, naphthalocyanine, and derivatives thereof.

7. The electrode material for an organic semiconductor device according to claim 1,
wherein the surface tension adjuster is at least one alcohol-based solvent selected from the group consisting of isopropanol, ethanol, and methoxy ethanol.

8. A method for forming an electrode pattern on a substrate, the method comprising:
a coating film forming step of forming a coating film by coating the substrate with the electrode material for an organic semiconductor device according to claim 1.

9. The method for forming an electrode pattern according to claim 8, further comprising, before the coating film forming step:
a bank forming step of forming a bank at an outer peripheral part of a region in which the electrode pattern is formed.

10. An organic thin-film transistor comprising:
an electrode formed using the electrode material for an organic semiconductor device according to claim 1.

11. The organic thin-film transistor according to claim 10, comprising:
a gate electrode;
a gate insulating film;
an organic semiconductor layer; and
a source electrode and a drain electrode disposed on the organic semiconductor layer,
wherein any one or both of the source electrode and the drain electrode are the electrodes formed using an electrode material for an organic semiconductor device wherein said electrode material comprises:
inorganic nanoparticles;
an organic π-conjugated ligand;
water;
0.0005% to 15% by mass of a fluorine-based surfactant; and
a surface tension adjuster of which a dielectric constant is 20 to 30,
wherein the organic π-conjugated ligand is a ligand having at least one hydrophilic substituent.

12. The organic thin-film transistor according to claim 11, wherein the organic semiconductor layer has a hydrophobic substituent.

13. The electrode material for an organic semiconductor device according to claim 2,
wherein the inorganic nanoparticles are metal nanoparticles.

14. The electrode material for an organic semiconductor device according to claim 2,
wherein the hydrophilic substituent included in the organic π-conjugated ligand is at least one selected from the group consisting of hydroxyl group, an aldehyde group, a carboxyl group, a carbonyl group, an ester group, an amino group, an alkylamino group, an amide group, an imide group, a phosphonic acid group, a sulfonic acid group, a cyano group, a thiol group, a nitro group, an ether group, and salts thereof.

15. The electrode material for an organic semiconductor device according to claim 3,
wherein the hydrophilic substituent included in the organic π-conjugated ligand is at least one selected from the group consisting of hydroxyl group, an aldehyde group, a carboxyl group, a carbonyl group, an ester group, an amino group, an alkylamino group, an amide group, an imide group, a phosphonic acid group, a sulfonic acid group, a cyano group, a thiol group, a nitro group, an ether group, and salts thereof.

16. The electrode material for an organic semiconductor device according to claim 4,
wherein the hydrophilic substituent included in the organic π-conjugated ligand is at least one selected from the group consisting of hydroxyl group, an aldehyde group, a carboxyl group, a carbonyl group, an ester group, an amino group, an alkylamino group, an amide group, an imide group, a phosphonic acid group, a sulfonic acid group, a cyano group, a thiol group, a nitro group, an ether group, and salts thereof.

17. The electrode material for an organic semiconductor device according to claim 2,
wherein the organic π-conjugated ligand is at least one ligand selected from the group consisting of porphyrin, phthalocyanine, naphthalocyanine, and derivatives thereof.

18. The electrode material for an organic semiconductor device according to claim 3,
wherein the organic π-conjugated ligand is at least one ligand selected from the group consisting of porphyrin, phthalocyanine, naphthalocyanine, and derivatives thereof.

19. The electrode material for an organic semiconductor device according to claim 4,
wherein the organic π-conjugated ligand is at least one ligand selected from the group consisting of porphyrin, phthalocyanine, naphthalocyanine, and derivatives thereof.

20. The electrode material for an organic semiconductor device according to claim 5,
wherein the organic π-conjugated ligand is at least one ligand selected from the group consisting of porphyrin, phthalocyanine, naphthalocyanine, and derivatives thereof.

* * * * *